United States Patent
Moharir (10) Patent No.: US 9,496,029 B1
(45) Date of Patent: Nov. 15, 2016

(54) 6T BITCELL FOR DUAL PORT SRAM MEMORIES WITH SINGLE-ENDED READ AND SINGLE-ENDED WRITE AND OPTIMIZED BITCELLS FOR MULTIPORT MEMORIES

(71) Applicant: SKAN TECHNOLOGIES CORPORATION, Willowbrook, IL (US)

(72) Inventor: Sudhir S. Moharir, Bangalore (IN)

(73) Assignee: SKAN TECHNOLOGIES CORPORATION, Willowbrook, IL (US)

( * ) Notice: Subject to any disclaimer, the term of this patent is extended or adjusted under 35 U.S.C. 154(b) by 0 days.

(21) Appl. No.: 15/051,951

(22) Filed: Feb. 24, 2016

Related U.S. Application Data (60) Provisional application No. 62/120,002, filed on Feb. 24, 2015.

(51) Int. Cl.
*G11C 11/00* (2006.01)
*G11C 11/419* (2006.01)
*G11C 11/412* (2006.01)

(52) U.S. Cl.
CPC .......... *G11C 11/419* (2013.01); *G11C 11/412* (2013.01)

(58) Field of Classification Search
CPC ..... G11C 11/412; G11C 11/419; G11C 8/16; G11C 11/413
See application file for complete search history.

(56) References Cited

U.S. PATENT DOCUMENTS 8,773,940 B2 * 7/2014 Badrudduza ............ G11C 8/16
365/154

* cited by examiner

*Primary Examiner* — David Lam
(74) *Attorney, Agent, or Firm* — Anderson Gorecki LLP (57) ABSTRACT

Described herein is a 6T bitcell for dual port SRAM that performs single ended read and single ended write. The bitcell and architecture does not have either a write bitline pair or a read bitline for each bitcell. It has only one read bitline per port per mux. Also presented herein is an 8T bitcell for dual port with single ended read and single ended write. The conventional dual port bitcell is an 8T bitcell which neither has single ended read nor has single ended write. Our bitcell which gives single ended read as well as single ended write has just 6 transistors. This gives area advantage. This bitcell also provides huge advantage in terms of leakage power, dynamic power, and speed. Also presented bitcells and architectures for multiport memories where each additional port, only requires half or one additional transistor based on the chosen architecture as against two transistors in the conventional architectures.

35 Claims, 8 Drawing Sheets

PRIOR ART

*FIGURE 1*

PRIOR ART

*FIGURE 2*

PRIOR ART

6T BITCELL FOR DUAL PORT SRAM MEMORIES WITH SINGLE-ENDED READ AND SINGLE-ENDED WRITE AND OPTIMIZED BITCELLS FOR MULTIPORT MEMORIES

CROSS REFERENCE TO RELATED APPLICATIONS

The present application claims priority to U.S. Provisional Patent Application No. 62/120,002 filed on Feb. 24, 2015 which is related to U.S. Provisional Patent application No. 62/036,189 filed on Aug. 12, 2014, and to U.S. patent application Ser. No. 14/519,468 filed on Oct. 21, 2014, and to U.S. Provisional Patent Application 62/098,460 filed on Dec. 31, 2014, to U.S. Provisional Patent Application No. 62/097,270 filed on Dec. 29, 2014, and to U.S. Patent Application No. 62/098,492 filed on Dec. 31, 2014 all of which are incorporated herein by reference in their entirety.

BACKGROUND

Traditional memory bit cells are well known and widely used. In a conventional six transistor (6T) bitcell, in order to write into the bitcell, a Write Line (WL) needs to go high and the zero is written either from the Bit Line (BL) or the Bit Line Bar (BLB) side by pulling either the BL or the BLB low depending on the data. The READ happens by sensing the differential between the BL and BLB when the WL goes high. In a conventional eight transistor (8T) bitcell the WRITE operation is same as in the 6T bitcell. The READ operation happens when the RWL goes high. The Read Bit Line (RBL) is precharged high. If the node B is high, then the RBL will go low, otherwise it will stay high.

In a conventional 8T bitcell used for dual port Static Random Access Memories (SRAMs), one can read and write through port A and can read and write through port B as well. That is why this bitcell is called a dual port bitcell. Neither read nor write is single ended. Please note that this bitcell has eight transistors.

As the single ended read is becoming more popular due to the complexity of the technology, the 2R2W (two read two write) bitcell came into existence. In this bitcell, the read operation is single ended. The price paid in terms of area is evident from the fact that it is now a 12T bitcell. For writing in to the bitcell through port A, WWLA (Write Word Line for port A) turns ON and the data is written through WBLA/WBLAB (Write Bitline for port A/Write Bitline for port A Bar). For reading through port A, RWLA (Read Word Line for port A) turn ON and the bitcell content is read through RBLA (Read Bit Line for port A). Similarly, for writing in to the bitcell through port B, WWLB turns ON and the data is written through WBLB/WBLBB. For reading through port B, RWLB turns ON and the bitcell content is read through RBLB.

If one wants to have one additional write port, it will need additional two transistors (a pair of passgates) and a pair of bitlines. If one wants to have one additional read port, it will need additional two transistors and one additional read bitline.

The 6T single port bitcell with single ended read and single ended write and the corresponding architecture have been described in our previous U.S. Provisional patent application 62/098,492 dated Dec. 31, 2014. One can do a single ended read and single ended write to function as a single port memory using a 6T bitcell.

SUMMARY

Conventional memory bit cells suffer from a number of deficiencies as recited above. Embodiments of the invention significantly overcome such deficiencies by providing a bitcell and memory architecture without a write bitline. In the previous patent applications (Ser. No.: 62/036,189 and Ser. No. 14/519,468), a 9T bitcell for 1R1W (One Read One Write) SRAM memories with single-ended read and single-ended write was described.

Described herein is a 6T bitcell for dual port SRAM that performs single ended read and single ended write. The presently described invention gives huge advantage in terms of area, dynamic power, leakage power and performance over the prior art in the industry. The bitcell and architecture does not have either a write bitline pair or a read bitline for each bitcell. It has only one read bitline per port per mux. Also described herein is an 8T bitcell for dual port with single ended read and single ended write.

The conventional dual port bitcell is an 8T bitcell. The conventional 2R2W bitcell which provides single ended read is a 12T bitcell. The presently described dual port bitcell which gives single ended read as well as single ended write has just 6 transistors. This gives area advantage. This bitcell also provides huge advantage in terms of leakage power, dynamic power, and speed.

We have also presented bitcells and architectures for multiport memories where for each additional port, we require only half or one additional transistor based on the chosen architecture as against two transistors in the conventional architectures.

Note that each of the different features, techniques, configurations, etc. discussed in this disclosure can be executed independently or in combination. Accordingly, the present invention can be embodied and viewed in many different ways. Also, note that this summary section herein does not specify every embodiment and/or incrementally novel aspect of the present disclosure or claimed invention. Instead, this summary only provides a preliminary discussion of different embodiments and corresponding points of novelty over conventional techniques. For additional details, elements, and/or possible perspectives (permutations) of the invention, the reader is directed to the Detailed Description section and corresponding figures of the present disclosure as further discussed below.

BRIEF DESCRIPTION OF THE DRAWINGS

The foregoing will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The embodiments set forth below represent the necessary information to enable those skilled in the art to practice the invention and illustrate the best mode of practicing embodiments of the invention. Upon reading the following description in light of the accompanying figures, those skilled in the art will understand the concepts of the invention and recognize applications of these concepts not particularly addressed herein. It should be understood that these concepts and applications fall within the scope of the disclosure and the accompanying claims.

The preferred embodiment of the invention will now be described with reference to the accompanying drawings. The invention may, however, be embodied in many different forms and should not be construed as limited to the embodiment set forth herein; rather, this embodiment is provided so that this disclosure will be thorough and complete, and will fully convey the scope of the invention to those skilled in the art. The terminology used in the detailed description of the particular embodiment illustrated in the accompanying drawings is not intended to be limiting of the invention. In the drawings, like numbers refer to like elements.

Figure 1:
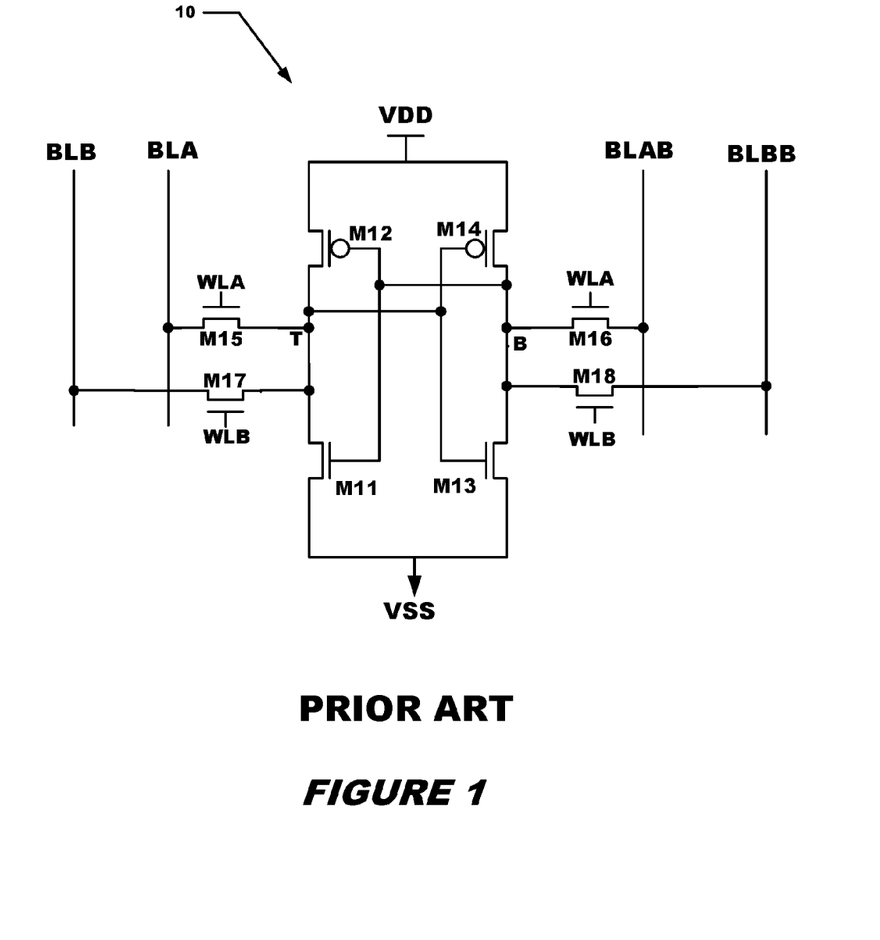
FIG. 1 depicts a schematic diagram of a conventional 8T dual port bitcell.
Figure 2:
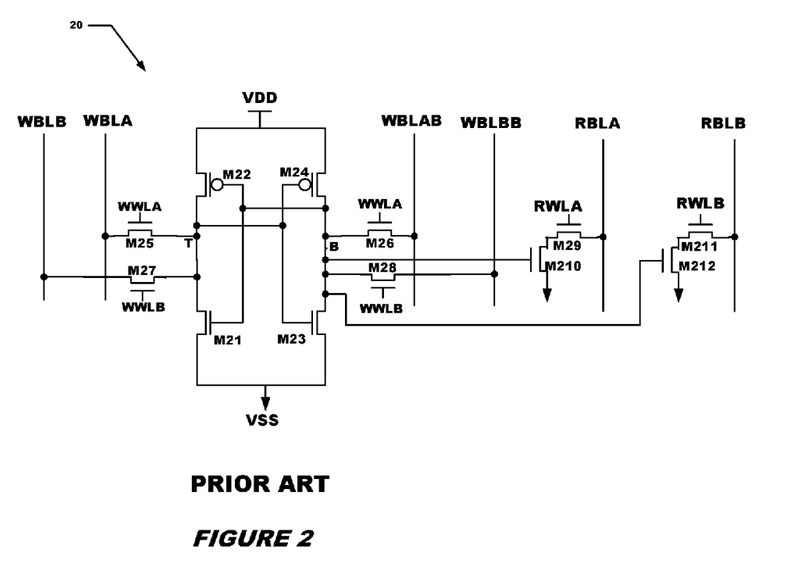
FIG. 2 depicts a schematic diagram of a conventional 12T bitcell for 2R2W SRAM.
Figure 3:
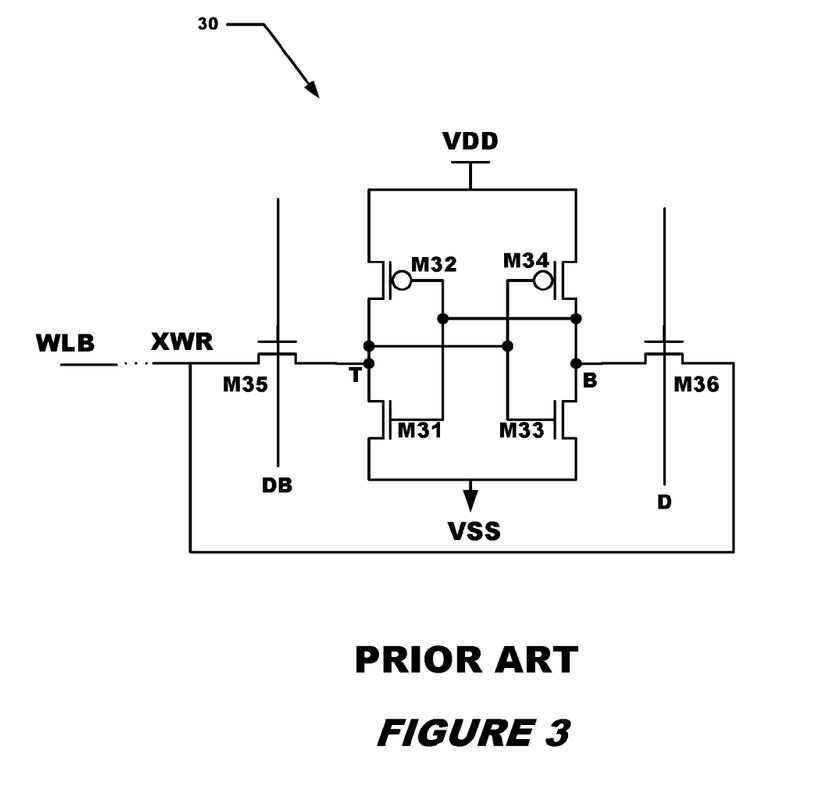
FIG. 3 depicts a schematic diagram of a 6Tsingle port SRAM bitcell with single ended read and single ended write taken from our previous patent.

FIG. 1 shows a conventional 8T bitcell, discussed in the background. FIG. 2 shows a conventional 12T bitcell for 2R2W SRAM, also described in the background. FIG. 3 shows a 6T bitcell for single port SRAM bitcell with single ended read and single ended write, described in U.S. Provisional Patent Application No. 62/098,492.

Figure 4:
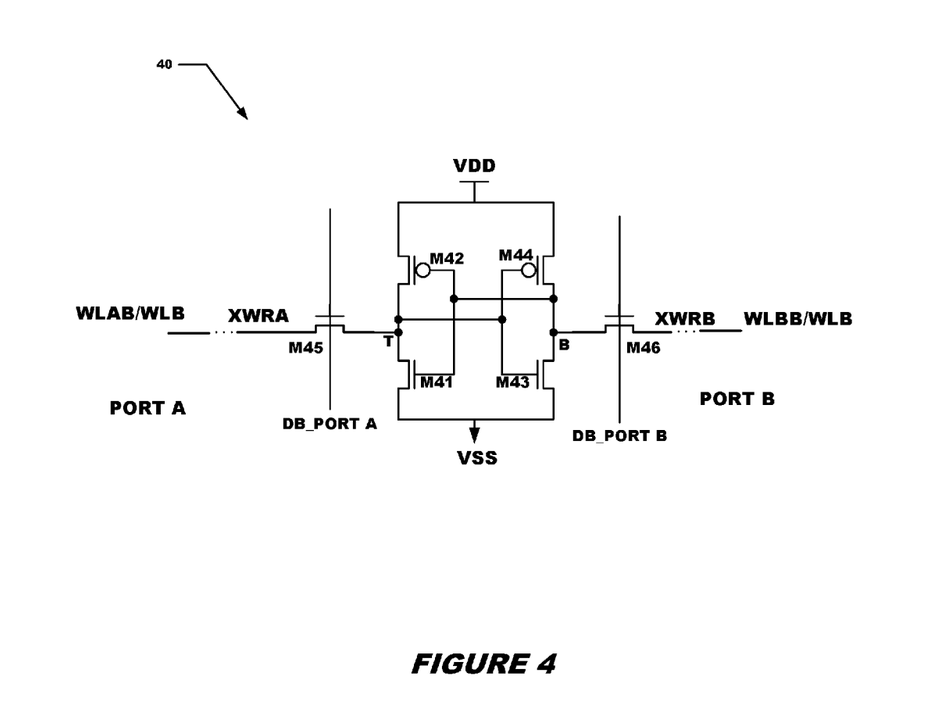
FIG. 4 depicts a schematic diagram of a particular embodiment of a 6T dual port SRAM bitcell with single ended read and single ended write in accordance with a particular embodiment of the present invention.

Referring now to FIG. 4, a particular embodiment of the present invention is shown. Here there are two separate ports; port A and port B and can use this 6T bitcell as a full dual port bitcell where a read and a write can be done from each of the ports. This bitcell works as a dual port bitcell as follows. Regarding port A, when neither READ nor WRITE operation is happening through port A, WL_A (Word Line for port A) and DB_portA are kept low. Signal WL_A is not used in FIG. 4. WL_A is generated in the leafcell called WDA (Wordline Driver for port A) and WLAB (Word Line for port A Bar) which is used in FIG. 4 is the inverted version of WL_A. When the bitcell is not accessed through port A, WLAB stays high. As the access passgate, M45 is OFF; any read or write operation does not happen. To write into the bitcell through port A, the WL_A goes high, WLAB goes low, and either DB_portA or DB_portB will go high, depending on the data polarity. If WL_A and DB_portA are high, then the node T will be pulled low. If WL_A and DB_portB are high, then the node B will be pulled low. This is how a write into the bitcell through port A is performed.

Note that a conventional write driver which drives the write bitline in conventional architectures is not required. Consequently, write bitline precharge is not required. Even during a write operation, either T or B will be exposed to the outside influence. Other bitcells on the same wordline WL_A are not exposed to the outside influence because for those bitcells, both DB_portA and DB_portB will be OFF. In the conventional bitcells, both T and B for all the bitcells on the wordline are exposed to the outside influence. Note that the DB_portA and DB_portB signals which control the write pass transistors of the 6T bitcell will have the "data" and the column address information encoded in them. For an unselected column, both DB_portA and DB_portB will always stay low.

The bitcell shown in FIG. 4 can be used for single ended READ also. During the READ cycle for port A, The WLAB driver will be disconnected from the node XWRA. Now, if DB_portA goes high, XWRA will fall if the node T is at "zero". For DB_portA high and node T at "one", the XWRA will stay high. This is how the data stored in the bitcell can be read from the "DB_portA" passgate side or through port A. The node XWRA can be sensed by a simple invertor or any other single ended sense amplifier. The polarity of the final output "QA" will match with the polarity of the node T.

Regarding port B, when neither READ nor WRITE operation is happening through port B, WL_B (Word Line for port B) and DB_portB are kept low. WL_B is generated in the leafcell called WDB (Wordline Driver for port B) and WLBB (Word Line for port B Bar) which is used in FIG. 4 is the inverted version of WL_B. When the bitcell is not accessed through port B, WLBB stays high. As the access passgate, M46 is OFF; any read or write operation does not happen. To write into the bitcell through port B, the WL_B goes high, WLBB goes low, and either DB_portB or DB_portA will go high, depending on the data polarity. If WL_B and DB_portB are high, then the node B will be pulled low. If WL_B and DB_portA are high, then the node T will be pulled low. This is how we write into the bitcell through port B.

Figure 5:
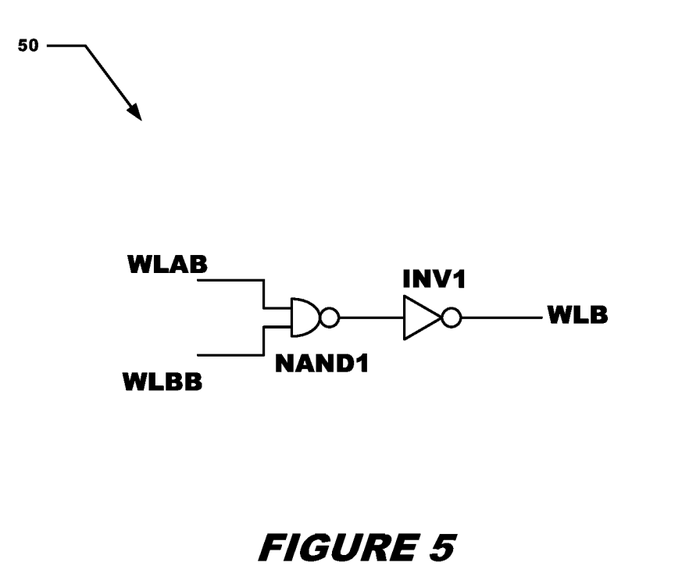
FIG. 5 depicts a schematic diagram of a particular embodiment of a WLB Driver in accordance with a particular embodiment of the present invention.

For the correct functionality of the dual port, WLAB and WLBB need to be effectively combined externally as shown in FIG. 5. Note that WLAB is a pulse controlled by the port A row address and the GTPA (Global Timing Pulse for port A) and WLBB is a pulse controlled by the port B row address and the GTPB (Global Timing Pulse for port B).

One limitation in this architecture is that one cannot write opposite data through port A and port B at the same time on any given column simultaneously. If one has to write opposite data through port A and port B on the same column, then the write cycles for the two ports need to be staggered by at least one cycle time. Using arbitration logic in dual port memories is very common. This is a very small disadvantage keeping in mind that a 6T bitcell is being used instead of an 8T or 12T bitcell; along with the other PPA advantages.

During the READ cycle for port B, The WLBB driver will be disconnected from the node XWRB. Now, if DB_portB goes high, XWRB will fall if the node B is at "zero". For DB_portB high and node B at "one", the XWRB will stay high. This is how the data stored in the bitcell can be read from the "DB_portB" passgate side or through port B. The node XWRB can be sensed by a simple invertor or any other single ended sense amplifier. The polarity of the final output "QB" will be opposite to the polarity of the node B.

Figure 6:
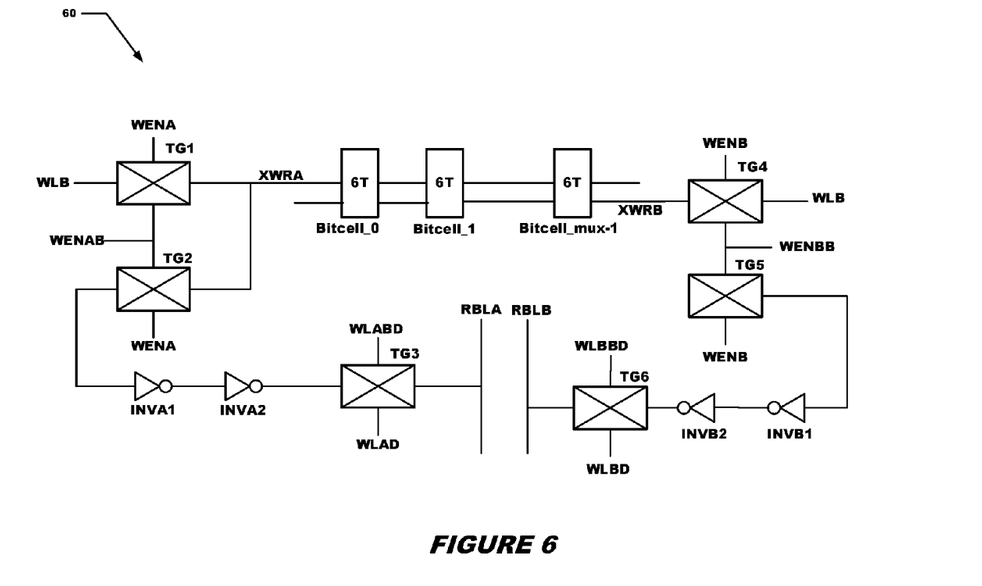
FIG. 6 depicts a schematic diagram showing bitcells of one mux on a row and the data architecture to perform single ended read and single ended write in a dual port SRAM in accordance with a particular embodiment of the present invention.

A top level block diagram of how the single ended read and single ended write operation can happen with this 6T bitcell in the dual port SRAM is shown in FIG. 6.

A slice of columns is formed having a size of "column mux". For example, if the column mux is 8, then the slice has 8 columns. This is because there is a need to read only one bitcell per mux on any given wordline. FIG. 6 shows single ended read. If DB_portA is high, the bitcell content will be read from the "T" side or the port A side. If DB_portB is high, the bitcell content will be read from the "B" side or from the port B side. INVA1 for port A and INVB1 for port B will sense the data and will put the data on the RBLA/RBLB only if the WL_A/WL_B is active for that row; otherwise not. Note that the transmission gate TG3 is controlled by the delayed version of WL_A and the transmission gate TG6 is controlled by the delayed version of WL_B.

For port A, when WENA (Write Enable for port A) is low, a write operation is performed as TG1 is ON and TG2 is OFF. When WENA is high, a read operation is performed as TG1 is OFF and TG2 is ON. For port B, when WENB (Write Enable for port B) is low, a write operation is performed as TG4 is ON and TG5 is OFF. When WENB is high, a read operation is performed as TG4 is OFF and TG5 is ON. In an alternative scheme (not shown in FIG. 6), TG2 gate can be controlled with a combination of WENA and WL_A so that it will be ON only during a read operation and only when the WL_A is ON, otherwise not. Similarly, TG5 gate can be controlled with a combination of WENB and WL_B so that it will be ON only during a read operation and only when the WL_B is ON, otherwise not. The INVA1/INVB1 invertors can be tristated with the WLAB/WLBB signals so that they will not switch unless the WL_A/WL_B are selected. In short, there are multiple ways to reduce the switching logic during a read operation.

The output of INV2/INV4 will drive the RBLA/RBLB only if the corresponding WL_A/WL_B is ON. For all other unselected WL_A/WL_B, the output of INV2/INV4 will not drive RBLA/RBLB as the transmission gate TG3/TG6 will be OFF.

Here, there is only one RBLA/RBLB per mux and the final output QA/QB can be taken from RBLA/RBLB directly or with buffering and keeper latch as per the design requirements.

Figure 7:
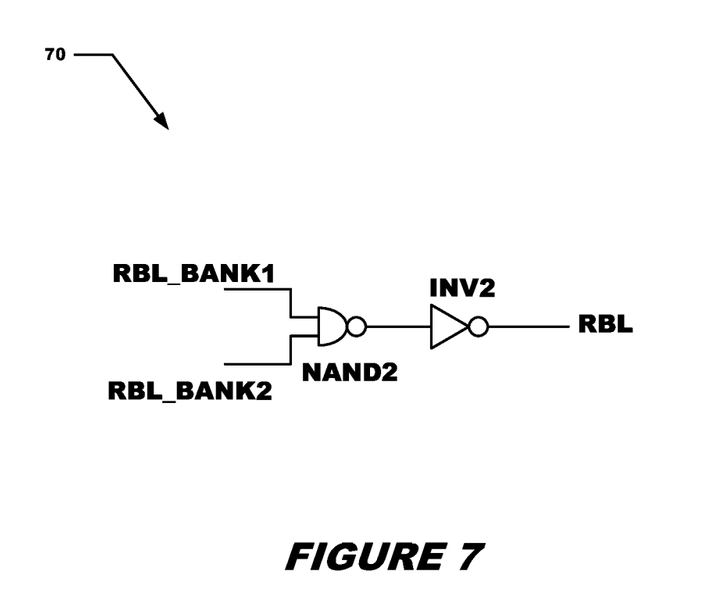
FIG. 7 depicts a schematic diagram of a particular embodiment of an RLB Driver in accordance with a particular embodiment of the present invention.

If number of rows is high, then hierarchy can be added on the RBLA/RBLB. For example, refer to FIG. 7. The RBLA/RBLB can be divided in smaller bitlines of rows 32 or 64, etc. Designer needs to keep track of the data polarity. Additional sensing circuitry can be added in the layout in a small slice between the two muxes without taking much of the area. A substrate tap can be added in the slice area.

Advantages of the present invention include the use of only one RBLA/RBLB per mux. Therefore muxing is not required towards the QA/QB output. At the same time, if the number of columns per mux is high, say for mux64, then a slice can be added after every 8 or 16 columns and then mux the RBLAs/RBLBs at the bottom of the instance to get the final QA/QB output. These are minor architectural changes that the designer can always do based on the PPA requirements.

One more advantage of this architecture is that it is very easy to implement the bitwrite functionality. Bitwrite is a condition where a write can be performed into only a part of the full word and the read operation will happen on the remaining part of the word. As shown in FIG. 6, the read or write operation of each mux can be controlled separately. So based on the bitwrite requirement, the transmission gates of port A (TG1 and TG2) and of port B (TG4 and TG5) can be controlled to perform either read or write on a given mux or bit.

Figure 8:
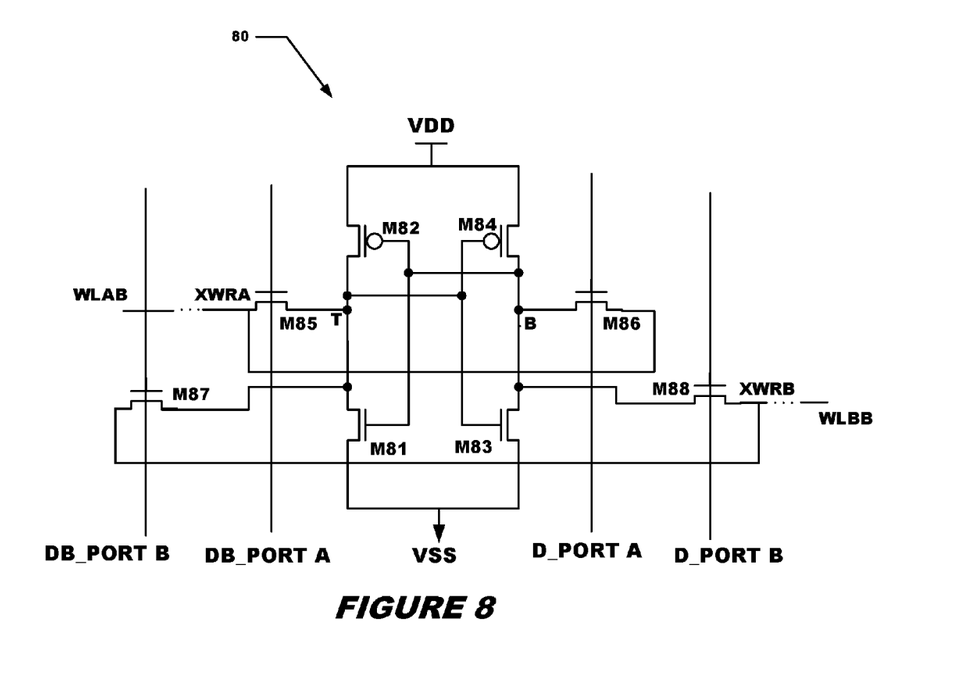
FIG. 8 depicts a schematic diagram showing an 8T bitcell for dual port SRAM with single ended read and single ended write in accordance with a particular embodiment of the present invention.

Described above is how the 6T bitcell can be used in a dual port SRAM. It has one limitation that opposite data cannot be written simultaneously on the same column. For those users who do not want this limitation, an 8T dual port bitcell as shown in FIG. 8 can be used. The bitcell described in FIG. 8 works well with the architecture described in FIG. 6. The only difference is that the 8T bitcell uses separate wordlines WLAB/WLBB.

Both 6T and 8T bitcells do not have the common issue of half contention which is always encountered in the conventional 8T dual port SRAM cell. This is also a major achievement of our bitcells that would improve yield and the performance.

In the conventional 8T bitcell, if a read from both the ports is done simultaneously, the load on the bitcell pulldown doubles and the read speed correspondingly reduces. In the presently described bitcells, 6T or 8T, such a phenomenon does not occur. This will again greatly improve the speed of the dual port.

In the presently described bitcells and architectures, the bitcell does not have to drive the bitline capacitance for reading to begin with; thereby giving the speed advantage. The advantages of significantly lower leakage power and dynamic power will always be there with these bitcells as explained in our earlier patents. So we see that the dual port bitcells and architectures give huge advantage in terms of leakage power, dynamic power, area, speed, and yield.

The dual port bitcell can very easily be extended to the multiport bitcells including multiport register files. Multiport register files are memories where the user can have different number of write ports and different number of read ports. Multiport register files are typically used inside or along with the microprocessors. Any improvement in the register files will improve the Central Processor Units (CPUs) and hence the Systems On a Chip (SOCs) that use these CPUs.

Referring back to FIG. 2, it would become evident that with conventional bitcells, each write port would add two transistors (for example, M25 and M26 or M27 and M28). Also, each read port would add two transistors (for example, M29 and M210, or M211 and M212). Now, looking at the present bitcell in FIG. 4, two write ports and two read ports can be added with the addition of total two transistors (for example, M45 and M46). This is like half a transistor per additional port. This is great improvement. The limitation is that one transistor provides one read and one write port; only one of them (either read or write) can be used in a given cycle. Both the read and the write cannot be used in the same cycle. If the user needs exclusive read or write ports, then the bitcells would require additional one transistor per port as seen from FIG. 4 and FIG. 6 (for example, M45). This also is a great improvement over the traditional multiport bitcells.

So in summary, even for multiport register files, the presently described bitcells and architectures will give a huge advantage in area, speed, leakage power and dynamic power, just as in case of the dual port memories. The area advantage that these bitcells will give over the conventional multiport bitcells will increase with the number of ports.

A 6T bitcell for dual port SRAM has been described that performs single ended read and single ended write. Our current invention gives huge advantage in terms of area, dynamic power, leakage power and performance over the prior art in the industry. The bitcell and architecture does not have either a write bitline pair or a read bitline for each bitcell. It has only one read bitline per port per mux.

Also described is an 8T bitcell for dual port with single ended read and single ended write. The conventional dual port bitcell is an 8T bitcell. The conventional 2R2W bitcell which provides single ended read is a 12T bitcell. Our dual port bitcell which gives single ended read as well as single ended write has just 6 transistors. This gives area advantage. This bitcell also provides huge advantage in terms of leakage power, dynamic power, and speed.

We have also presented bitcells and architectures for multiport memories where for each additional port, we require only half or one additional transistor based on the chosen architecture as against two transistors in the conventional architectures.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

Throughout the entirety of the present disclosure, use of the articles "a" or "an" to modify a noun may be understood to be used for convenience and to include one, or more than one of the modified noun, unless otherwise specifically stated.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

Having described preferred embodiments of the invention it will now become apparent to those of ordinary skill in the art that other embodiments incorporating these concepts may be used. Accordingly, it is submitted that that the invention should not be limited to the described embodiments but rather should be limited only by the spirit and scope of the appended claims.

What is claimed is:

1. A memory architecture comprising:
   a plurality of transistors arranged to form a bit cell, said bit cell comprising a first transistor, a second transistor, a third transistor and a fourth transistor configured to store a bit of data;
   a fifth transistor having a gate coupled to a Data Bar Port A (DB_PORTA) signal, said fifth transistor having a drain coupled to a drain of said first transistor (Node T) and a Source coupled to an XWRA node also selectively connected to a Word Line for port A Bar/Word Line Bar (WLAB/WLB) signal; and
   a sixth transistor having a gate coupled to a Data Bar Port B (DB_PORTB) signal, a drain coupled to a drain of said third transistor (Node B) and a source coupled to an XWRB node also selectively connected to a Word Line for port B Bar/Word Line Bar (WLBB/WLB) signal.

2. The memory architecture of claim 1 wherein said bit cell comprises:
   said first transistor of said plurality of transistors having a gate coupled to a gate of said second transistor of said plurality of transistors, a drain of said third transistor of said plurality of transistors, and a drain of said fourth transistor of said plurality of transistors, said first transistor having a source connected to said ground and a drain coupled to a drain of said second transistor, a gate of said third transistor and a gate of said fourth transistor;
   said second transistor having a source coupled to a positive reference voltage;
   said third transistor having a source connected to said ground; and
   said fourth transistor having a source coupled to said positive reference voltage.

3. The memory architecture of claim 1 wherein when neither a READ operation nor a WRITE operation is happening through Port A, said WLAB is high and said DB_PortA is low.

4. The memory architecture of claim 1 wherein to write into said bitcell trough said Port A, said WLAB goes low, and one of said DB_PortA or said DB_PortB will go high, depending on the data polarity.

5. The memory architecture of claim 1 wherein if said WLB is low and said DB_PortA is high, then said node T will be pulled low.

6. The memory architecture of claim 1 wherein to perform a single ended READ from said bitcell from Port A, said WLAB driver is disconnected from said XWRA node, and if said DB_PortA is high, said XWRA node will go to a low value if said node T is at a zero, and if said DB_PortA is high and said node T is at a One, then said XWRA node will stay high.

7. The memory architecture of claim 1 wherein when neither a READ operation nor a WRITE operation is happening through Port B, said WLBB is high and said DB_PortB is low.

8. The memory architecture of claim 1 wherein to write into said bitcell through said Port B, said WLBB goes low, and one of said DB_PortA or said DB_PortB will go high, depending on the data polarity.

9. The memory architecture of claim 1 wherein if said WLB is low and said DB_PortB is high, then said node B will be pulled low.

10. The memory architecture of claim 1 wherein to perform a single ended READ from said bitcell from Port B, said WLBB driver is disconnected from said XWRB node, and if said DB_PortB is high, said XWRB node will go to a low value if said node B is at a zero, and if said DB_PortB is high and said node B is at a One, then said XWRB node will stay high.

11. The memory architecture of claim 1 wherein said DB_PORTA and DB_PORTB lines encode a data polarity as well as column decode information.

12. The memory architecture of claim 1 wherein a whole row does not go active for writing, wherein only a cross-over bitcell where the WLB and DB_PORTA or DB_PORTB lines are ON, goes active for writing.

13. The memory architecture of claim 1 wherein only one side of the bitcell is accessed during write operation where the "write zero" operation is expected to happen.

14. The memory architecture of claim 1 wherein bitcell access is controlled by combining a row address, a column address, and data polarity information to uniquely determine a bitcell as well as a side of said bitcell that is accessed during write.

15. The memory architecture of claim 1 wherein two write ports and two read ports can be added with the addition of only two transistors in the bit cell to build multiport memories.

16. The memory architecture of claim 1 wherein an exclusive read or write port can be added with the addition of only one transistor in the bit cell per port to build multiport memories.

17. A memory architecture comprising:
a plurality of transistors arranged to form a bit cell, said bit cell comprising a first transistor, a second transistor, a third transistor and a fourth transistor configured to store a bit of data;
a fifth transistor having a gate coupled to a Data Bar Port A (DB_PORTA) signal, said fifth transistor having a drain coupled to a drain of said first transistor (Node T) and a Source coupled to an XWRA node also selectively connected to a Word Line for port A Bar (WLAB) signal; and
a sixth transistor having a gate coupled to a Data Port A (D_PORTA) signal, a drain coupled to a drain of said third transistor (Node B) and a source coupled to an XWRA node also selectively connected to a Word Line for port A Bar (WLAB) signal;
a seventh transistor having a gate coupled to a Data Bar Port B (DB_PORTB) signal, said seventh transistor having a drain coupled to a drain of said first transistor (Node T) and a source coupled to an XWRB node also selectively connected to a Word Line for port B Bar (WLBB) signal; and
an eighth transistor having a gate coupled to a Data Port B (D_PORTB) signal, a drain coupled to a drain of said third transistor (Node B) and a source coupled to an XWRB node also selectively connected to a Word Line for port B Bar (WLBB) signal.

18. The memory architecture of claim 17 wherein said bit cell comprises:
said first transistor of said plurality of transistors having a gate coupled to a gate of said second transistor of said plurality of transistors, a drain of said third transistor of said plurality of transistors, and a drain of said fourth transistor of said plurality of transistors, said first transistor having a source connected to said ground and a drain coupled to a drain of said second transistor, a gate of said third transistor and a gate of said fourth transistor;
said second transistor having a source coupled to a positive reference voltage;
said third transistor having a source connected to said ground; and
said fourth transistor having a source coupled to said positive reference voltage.

19. The memory architecture of claim 17 wherein to write into said bitcell through said Port A, said WLAB goes low, and one of said DB_PortA or said D_PortA will go high, depending on the data polarity.

20. The memory architecture of claim 17 wherein to perform a single ended READ from said bitcell from Port A, said WLAB driver is disconnected from said XWRA node, and if said DB_PortA is high, said XWRA node will go to a low value if said node T is at a zero, and if said DB_PortA is high and said node T is at a One, then said XWRA node will stay high.

21. The memory architecture of claim 17 wherein to write into said bitcell through said Port B, said WLBB goes low, and one of said DB_PortB or said D_PortB will go high, depending on the data polarity.

22. The memory architecture of claim 17 wherein to perform a single ended READ from said bitcell from Port B, said WLBB driver is disconnected from said XWRB node, and if said DB_PortB is high, said XWRB node will go to a low value if said node T is at a zero, and if said DB_PortB is high and said node T is at a One, then said XWRB node will stay high.

23. A memory datapath architecture comprising:
a row-slice of bit cells, wherein each bit cell comprises:
a plurality of transistors comprising a first transistor, a second transistor, a third transistor and a fourth transistor configured to store a bit of data;
a fifth transistor having a gate coupled to a Data Bar Port A (DB_PORTA) signal, said fifth transistor having a drain coupled to a drain of said first transistor (Node T) and a Source coupled to an XWRA node also selectively connected to a Word Line for port A Bar/Word Line Bar (WLAB/WLB) signal; and
a sixth transistor having a gate coupled to a Data Bar Port B (DB_PORTB) signal, a drain coupled to a drain of said third transistor (Node B) and a source coupled to an XWRB node also selectively connected to a Word Line for port B Bar/Word Line Bar (WLBB/WLB) signal;
said row-slice of bit cells connected in electrically parallel configuration so that the XWRA nodes of all the bitcells are connected to each other, and wherein the XWRB nodes of all the bitcells are connected to each other;
wherein said XWRA signal is further selectively connected to said WLB signal through a first switch TG1 (Transmission Gate 1), and wherein said XWRA signal is selectively connected to a first sense invertor INVA1 through a second switch TG2 (Transmission Gate 2);
wherein an output of said INVA1 is connected to an input of a second invertor, INVA2 and wherein an output of said INVA2 is selectively connected to a signal RBLA (Read Bit Line A) through a third switch called TG3 (Transmission Gate 3);
wherein said XWRB signal is further selectively connected to said WLB signal through a fourth switch TG4 (Transmission Gate 4), and wherein XWRB signal is selectively connected to a sense invertor INVB1 through a fifth switch TG5 (Transmission Gate 5) and wherein an output of the said INVB1 is connected to an input of another second invertor, INVB2, and wherein an output of the said INVB2 is selectively connected to a signal RBLB (Read Bit Line B) through a sixth switch called TG6 (Transmission Gate 6).

24. The datapath architecture of claim 23 wherein the maximum number of bitcells in a row-slice can be equal to the number of column mux factor used.

25. The datapath architecture of claim 23 wherein the minimum number of row-slices in a row equals the number of bits.

26. The datapath architecture of claim 23 wherein the said switches TG1, TG2, TG3, TG4, TG5, and TG6 are selected to be the transmission gates or any other type of switches including the tri-statable invertors.

27. The datapath architecture of claim 26 wherein said invertors INVA1 and INVB1 can comprise tri-statable invertors controlled by said WLB signal to reduce the switching logic.

28. The datapath architecture of claim 23 wherein said TG1 and said TG2 are controlled by said WENA (Write Enable A) and said WENAB (Write Enable A Bar) signals and said TG3 is controlled by said WLAD (Word Line A Delayed) and WLABD (Word Line A Bar Delayed) signals.

29. The datapath architecture of claim 23 wherein said TG4 and said TG5 are controlled by said WENB (Write Enable B) and said WENBB (Write Enable B Bar) signals and said TG6 is controlled by said WLBD (Word Line B Delayed) and WLBBD (Word Line B Bar Delayed) signals.

30. The datapath architecture of claim 23 wherein the said TG1, said TG2, and said TG3 are controlled by a combination of said WLB and said WENA signals and wherein, said TG4, said TG5, and said TG6 are controlled by a combination of said WLB and said WENB signals.

31. The datapath architecture of claim 23 wherein said RBLA line is pre-charged high and to perform a read of data from said bit cell through port A, said WL_A line goes high and wherein said RBLB line is precharged high and to perform a read of data from said bit cell through port B, said WL_B line goes high.

32. The datapath architecture of claim 23 wherein said RBLA line is pre-charged low and to perform a read of data from said bit cell, said WL_A line goes high by changing the polarity of the read output by replacing said INVA2 with a short circuit and said RBLB is pre-charged low and to perform a read of data from said bit cell, said WL_B line goes high by changing the polarity of the read output by replacing said INVB2 with a short circuit.

33. The datapath architecture of claim 23 wherein single ended READ and single ended WRITE from both the ports; said port A and said port B, can be done using a 6T bitcell.

34. The datapath architecture of claim 23 wherein there is only one RBLA per mux and the final output Q_A can be taken from RBLA directly or with buffering and keeper latch and wherein there is only one RBLB per mux and the final output Q_B can be taken from RBLB directly or with buffering and keeper latch.

35. The datapath architecture of claim 23 wherein only one sense input per port is generated for said row-slice and only one sense output per port is generated for said row-slice.

* * * * *